United States Patent [19]

Helda

[11] 4,028,722

[45] June 7, 1977

[54] CONTACT BONDED PACKAGED INTEGRATED CIRCUIT

[75] Inventor: Robert W. Helda, Hollywood, Fla.

[73] Assignee: Motorola, Inc., Chicago, Ill.

[22] Filed: Oct. 10, 1972

[21] Appl. No.: 296,185

Related U.S. Application Data

[60] Division of Ser. No. 80,378, Oct. 13, 1970, Pat. No. 3,698,073, which is a continuation of Ser. No. 691,041, Dec. 15, 1967, abandoned.

[52] U.S. Cl. .................................. 357/70; 357/69; 357/71; 174/52 FP; 174/52 PE

[51] Int. Cl.² ................. H01L 23/48; H01L 29/44; H02G 13/08

[58] Field of Search ................. 317/234, 3, 4, 5.4; 174/52 PE, DIG. 3; 357/69, 70, 71

[56] References Cited

UNITED STATES PATENTS

| | | | |
|---|---|---|---|
| 2,953,840 | 9/1960 | Freeburg | 357/70 |
| 3,171,187 | 3/1965 | Ikeda et al. | 357/70 |
| 3,262,022 | 7/1966 | Caracciola | 317/101 |
| 3,270,399 | 9/1966 | Ohntrup | 357/70 |
| 3,317,287 | 5/1967 | Caracciola | 357/70 |
| 3,341,649 | 9/1967 | James | 174/52 |
| 3,348,105 | 10/1967 | Doyle | 357/70 |
| 3,367,025 | 2/1968 | Doyle | 29/588 |
| 3,374,537 | 3/1968 | Doelp | 29/627 |
| 3,387,359 | 6/1968 | Dale et al. | 29/577 |
| 3,390,308 | 6/1968 | Marley | 317/100 |
| 3,391,426 | 7/1968 | Hugill | 357/70 |
| 3,404,319 | 10/1968 | Tsuji et al. | 357/70 |
| 3,413,713 | 12/1968 | Helda et al. | 29/588 |
| 3,423,516 | 1/1969 | Segerson | 357/70 |
| 3,431,092 | 3/1969 | Lehner | 357/70 |
| 3,436,810 | 4/1969 | Kauffman | 29/577 |
| 3,440,027 | 4/1969 | Hugle | 357/70 |
| 3,444,440 | 5/1969 | Bell et al. | 357/70 |
| 3,444,441 | 5/1969 | Helda et al. | 357/70 |
| 3,469,684 | 9/1969 | Keady et al. | 357/70 |
| 3,469,953 | 9/1969 | St. Clair et al. | 357/70 |
| 3,484,533 | 12/1969 | Kauffman | 174/52 |
| 3,497,947 | 3/1970 | Ardezzone | 29/577 |
| 3,517,438 | 6/1970 | Johnson et al. | 29/627 |
| 3,531,856 | 10/1970 | Bell et al. | 29/583 |
| 3,539,675 | 11/1970 | Hugill | 357/70 |
| 3,544,857 | 12/1970 | Byrne et al. | 317/234 |
| 3,560,808 | 2/1971 | Segerson | 357/70 |
| 3,574,815 | 4/1971 | Segerson | 357/70 |
| 3,577,633 | 5/1971 | Homma et al. | 29/588 |
| 3,611,061 | 10/1971 | Segerson | 357/70 |
| 3,692,225 | 9/1972 | Lincoln | 357/70 |
| 3,698,074 | 10/1972 | Helda et al. | 357/70 |

FOREIGN PATENTS OR APPLICATIONS

| | | | |
|---|---|---|---|
| 782,035 | 8/1957 | United Kingdom | 357/70 |

OTHER PUBLICATIONS

Proc. I.R.E.E. — Australia, May 1968, J. C. Vanvesseni pp. 170–176.

*Primary Examiner*—Edward J. Wojciechowicz
*Attorney, Agent, or Firm*—Henry T. Olsen

[57] ABSTRACT

Wire bonding is eliminated in the assembly of microelectronic devices, by a process involving the direct bonding of circuit electrodes to a metallic sheet-frame member having a plurality of inwardly extending leads. A single-step bonding technique is employed for the simultaneous bonding of all leads to a semiconductor integrated circuit chip. Lateral confinement of the lead frame member during the bonding steps causes a buckling action in the lead fingers, to introduce a small but critical loop in each lead to ensure clearance between the lead fingers and the perimeter of the semiconductor chip, whereby electrical shorting is avoided. The loop also provides a structural flexibility in the leads, which tends to protect the bonding sites from excessive stresses. Subsequently, the first frame member including the bonded circuit is attached, preferably by resistance welding, to a second lead frame member of heavier gage and increased dimensions, suitable for connection with external circuitry. Excess portions of the first frame member are then removed, providing a completed assembly for packaging; e.g., plastic encapsulation or hermetic sealing, as in a ceramic-glass flat package.

2 Claims, 10 Drawing Figures

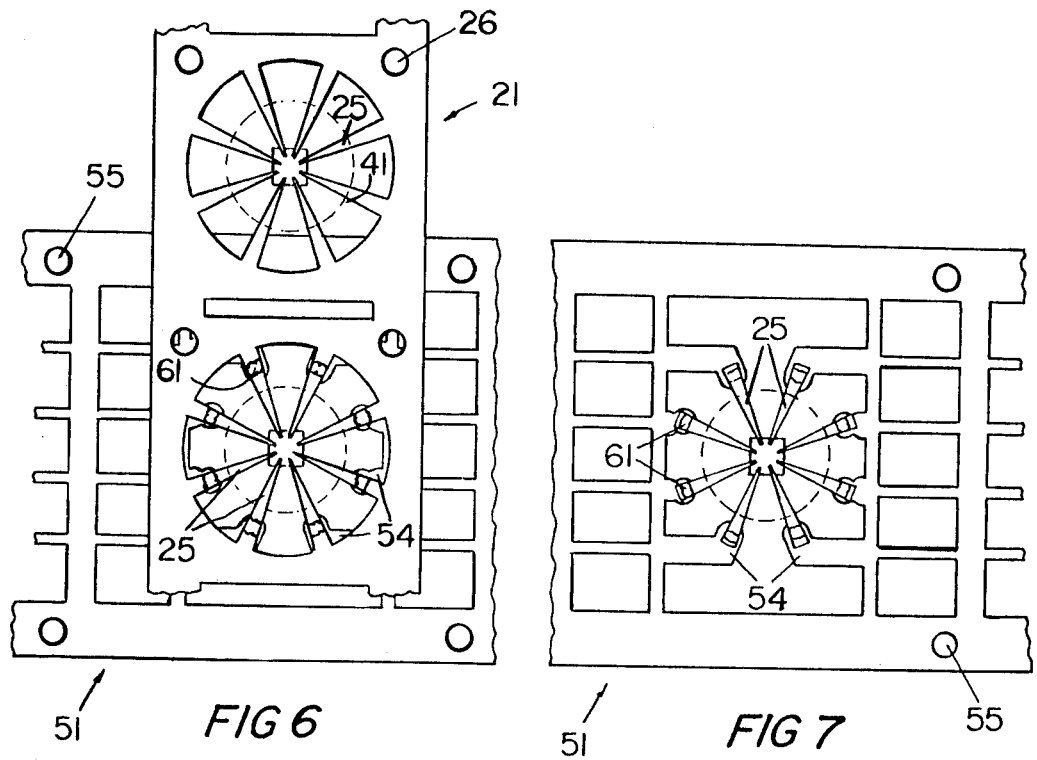
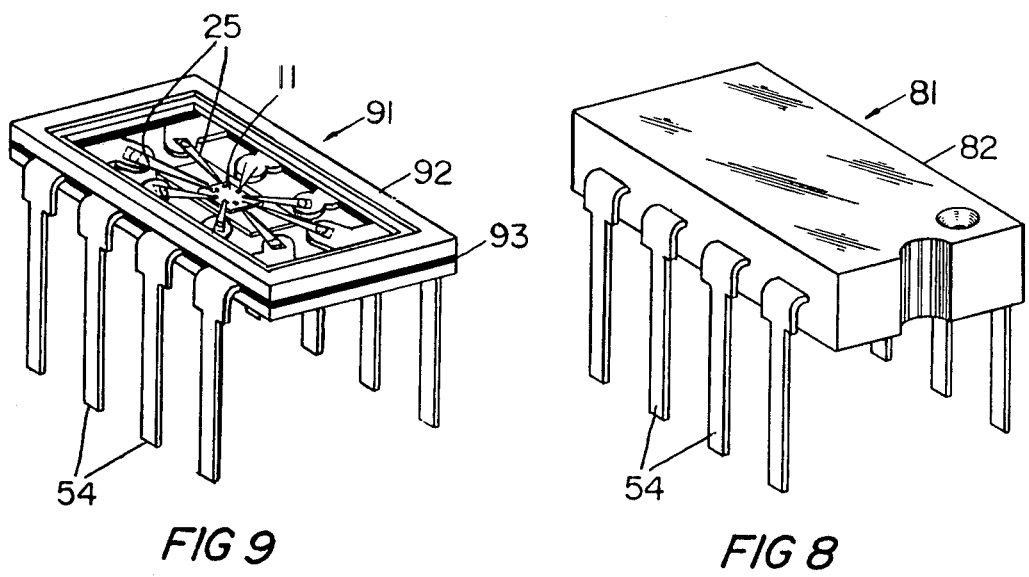

CONTACT BONDED PACKAGED INTEGRATED CIRCUIT

The present application is a divisional of application Ser. No. 80,378 filed Oct. 13, 1970, now U.S. Pat. No. 3,698,073 which latter application is a continuation of application Ser. No. 691,041 filed Dec. 15, 1967, and now abandoned, and is related to the application of Robert W. Helda and Harry J. Geyer, Ser. No. 56,081, filed June 29, 1970 as a continuation of application filed Dec. 15, 1967 as Ser. No. 691,040, and now abandoned.

BACKGROUND

This invention relates to the assembly and packaging of microelectronic devices, including particularly the contact bonding and assembly of integrated semiconductor circuits.

Various methods have been proposed for providing electrical connections between the ohmic-contact areas of an integrated microcircuit and the external package leads. The most common method in current use involved the thermocompression bonding of extremely fine wires to the points to be interconnected. In accordance with this technique, a 14-lead device, for example, requires 28 separate bonding steps, each requiring a careful positioning of the partially assembled device in the bonding apparatus.

The industry has recognized for some time that it would be desirable to eliminate the time and expense of wire bonding. Considerable attention has been devoted to the expedient of simply extending the internal portions of the package leads and tapering the lead ends to provide bonding tips which are small enough for attachment directly to the bonding pads of the semiconductor structure. This approach has not been successful, primarily due to the fundamental difference in structural specifications required for external package leads as compared with the specifications required of internal leads bonded to the ohmic-contact areas of a microcircuit.

For example, the use of external package leads made of 10-mil Kovar has become a standard practice for many devices. Efforts to bond 10-mil Kovar leads directly to the electrodes of an integrated circuit have proved disappointing. High-speed techniques for gold or aluminum wire bonding, such as thermocompression bonding and vibratory pressure welding, do not readily produce a reliable bond when applied to leads as thick as 10-mils, or when applied to metal leads which are less ductile than gold, aluminum, or copper, for example. Even when acceptable bonds are initially formed using a 10-mil lead frame, the leads are very susceptible to inadvertent detachment from the die as a result of subsequent stresses introduced by normal handling and incidental flexing of the assembly.

It has also been proposed to replace bonding wires with individual rigid metal clips for interconnecting the bonding pads of the semiconductor circuit with the external leads. This approach may be advantageous for some applications, but it has not been found to reduce the cost of assembly substantially.

THE INVENTION

It is an object of the invention to provide an improved method for the manufacture of microelectronic devices. More particularly, it is an object of the invention to provide an improved method for contact-bonding and packaging of an integrated circuit structure.

It is a further object of the invention to provide a new approach to the problem of electrically connecting the ohmic-contact pads of an integrated circuit with the external lead wires of the packaged device. More particularly, it is a further object of the invention to provide a bonding method for the simultaneous bonding of all lead members to the contact pads in a single step.

A primary feature of the invention is the use of first and second electrically conductive, substantially flat sheet-frame members having a plurality of inwardly extending fingers or leads. The first lead frame member is the relatively smaller and lighter of the two, the plurality of inwardly extending lead ends thereof being adapted for alignment with and bonding to the electrode pads of an integrated circuit structure. The second lead frame member is larger and heavier than the first, being constructed of a material well suited for use as the external leads of a packaged device. The plurality of inwardly extending leads of the second frame member terminates in a pattern adapted for alignment with and bonding to the respective leads of the first frame member at points generally located outside the periphery of the integrated circuit structure.

Another feature of the invention is the simultaneous bonding of all lead terminals of the first frame member to the corresponding electrode pads of the circuit structure in a single step. The bonding is achieved by positioning the lead frame and the circuit die in proper alignment, i.e., with each lead terminal in contact with a corresponding circuit bonding pad, and then applying bonding energy simultaneously to all bonding sites. Specific bonding techniques which may be used include soldering, brazing, resistance welding, and thermocompression bonding. A particularly suitable method is to form a pressure weld by applying compressive force in combination with high-frequency vibrations to form mechanical bonds or welds. Such a bonding technique, per se, is well known. However, its practice in the industry has involved the bonding of one wire at a time, similarly as in the case of the thermocompression bonding mentioned above.

An additional feature of the invention relates to the buckling or looping of the leads of the first frame member during the bonding operation, accomplished by a lateral confinement of the frame member. Since the preferred bonding step involves a substantial deformation of the lead terminals, axial or longitudinal stress is introduced along the lead elements, sufficient to cause a significant buckling of the leads in the direction of minimum resistance. A clearance is thereby provided between the leads and the edges of the circuit chip, which avoids the danger of electrical shorting.

In accordance with a more specific aspect of this feature of the invention, the buckling may be substantially enhanced by providing a short segment of reduced cross section in each lead at some point near the edge of the circuit chip. The buckling action introduces a small permanent loop in each lead providing a structural flexibility which tends to relieve the bonding sites of excessive inadvertent stresses.

The invention is embodied in a method for contact bonding and packaging of an integrated circuit structure, including the use of an electrically conductive, substantially flat first frame member having a plurality of inwardly extending fingers or leads adapted for alignment with and bonding to the electrodes of the integrated circuit. Typically, the first lead frame member is prepared from sheet aluminum or copper having a tensile strength of 10,000 to 24,000 p.s.i. and a thickness of about 1.5 to 4.0 mils, preferably about 2 mils. Other metals may be employed. The exact configuration of the leads may suitably be provided by chemical etching or mechanical stamping procedures well known in the art of metal fabrication. Advantageously, an elongated rectangular strip is provided which includes a plurality of identical frame members equally spaced along the length of the strip. The extreme flexibility of the first lead frame member permits it to be easily stored in the form of a continuous strip or belt wound on a spool, from which it is unwound for use as needed.

The method further includes the step of aligning and bonding the electrodes of the circuit die in contact with the leads of the first frame member by the application of compressive force and high-frequency vibrations. In accordance with a specific aspect of the invention, the bonding of all leads to the circuit die is completed in a single step. The preferred technique is to employ a bonding needle having a flat tip of an area sufficient to contact a major proportion of the area of the current die. The bonding needle is pressed against the reverse side of the circuit die with rigid support means provided on the face of the die to hold all the lead terminals in place on the bonding pads. In this manner the bonding energy is applied to the reverse side of the circuit chip and passes equally and simultaneously to all bonding sites. The bonding energy can instead be applied directly to the bonding sites by pressing the bonding needle toward the face of the circuit die, in contact with the lead ends. However, substantially improved results are obtained when applying the needle to the reverse side of the chip.

Bonding of the integrated circuit die to the leads of the first frame member is preferably carried out using automated equipment designed for operation on a lead frame supplied in continuous strip form, as mentioned above. The strip including the bonded die can then again be wound on a spool, if desired, for subsequent attachment to the second lead frame member. The degree of flexing which necessarily occurs during such an operation would impose sufficient stress upon the bonding sites to rupture a large percentage of the bonds, if a lead frame member having the stiffness required of external leads were used.

A second lead frame member is then provided, of relatively heavier gage and of larger dimensions than the first frame member, the second frame member also having a plurality of inwardly extending fingers or leads. The leads of the second frame member provide the external electrical connections of the finally completed package. The terminals of the inwardly extending leads are adapted for alignment with some portion of each corresponding lead of the first frame member. The second frame member may be constructed of Kovar, nickel, copper, steel, or other suitable metal, and is also preferably provided in the form of an elongated rectangular strip consisting of a plurality of equally spaced, identical units. A thickness of 6 to 12 mils is generally required of the second frame member, and a tensile strength of at least 30,000 p.s.i.

The second frame member is then aligned in contact with the leads of the first frame member and corresponding leads are welded or otherwise attached to one another. Preferably a resistance weld is formed, with all of the leads being welded simultaneously by means of a cylindrical welding element, for example. Other suitable methods include soldering, brazing, thermocompression bonding, ultrasonic, etc.

After completion of the welding step, excess portions of the first frame member outside the peripheral weld points are removed. They may be accomplished, for example, by simply ripping away those portions of the first frame member which extend beyond the weld points, or the excess frame material may be cut with a cylindrical knife edge in a manner analogous to the operation of a cookie cutter. The assembly is then ready for plastic encapsulation or other packaging techniques.

A further embodiment includes the step of attaching rigid support means to the leads of the first frame member, spanning the circuit die structure to relieve the bonding sites of excessive stress in handling and molding operations prior to encapsulation. Typically the rigid support means comprises a ceramic disc or rectangular plate having a diameter or side, respectively, substantially greater than the major axis of the circuit die, and the leads of the frame member are attached to the ceramic disc by means of a polymeric adhesive. Advantageously, the adhesive is selected for its capacity to provide a passivating effect on the surface of the semiconductor structure, and is applied to an area of the ceramic plate sufficiently large to cover the semiconductor surface as well as the bonded leads, firmly binding the assembly to the ceramic support. The disc substantially improves life test stresses related to thermal cycling.

DRAWINGS

FIG. 6 is a plan view illustrating the welding of the first frame member to the lead elements of the second frame member.

FIG. 7 is a plan view of the completed assembly, trimmed and ready for plastic encapsulation or other packaging techniques.

FIG. 8 is a perspective view illustrating a packaged unit wherein an assembly as shown in FIG. 7 is sealed within a plastic housing.

FIG. 9 is a perspective cut-away view of a hermetically sealed ceramic package illustrating another embodiment of the invention.

Figure 1:
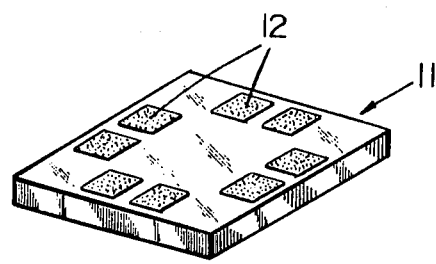
FIG. 1 is a greatly enlarged perspective view of an integrated circuit structure suitable for bonding and packaging in accordance with the invention.

In FIG. 1 integrated circuit chip 11 is seen to include eight bonding pads 12 of aluminum or other suitable metal built up about 1 micron above the surrounding surface of the circuit chip. It is particularly desirable to provide coplanar bonding pads, in order to improve the reliability with which all lead ends of the first frame member are attached thereto in a single bonding step. The remaining details of the integrated circuit structure are not shown since they are not essential to the concept of the present invention.

Figure 2:
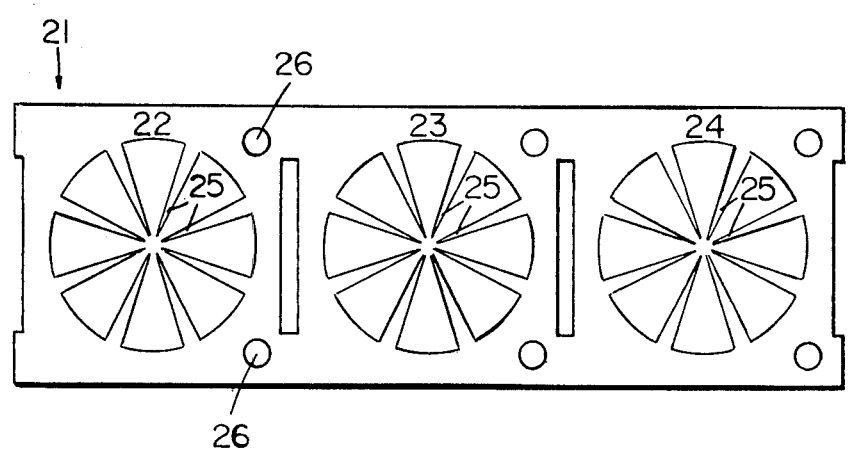
FIG. 2 is an enlarged plan view of the first lead frame member.

FIG. 2 illustrates the geometric configuration of one embodiment of the first lead frame member of the invention. Sheet metal strip 21 includes three identical lead frame sections 22, 23 and 24, each of which comprises a plurality of inwardly extending fingers or leads 25 corresponding in number to the number of bonding pads 12 of the circuit chip to be bonded thereto. Indexing holes 26 are provided to permit accurate positioning and alignment of the lead frame sections during the bonding operation in which the tips of leads 25 are attached to the bonding pads of the circuit chip.

Figure 3:
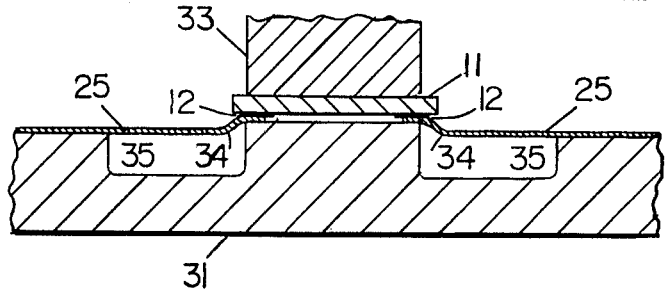
FIG. 3 is an elevational view in cross section, showing the simultaneously bonding of all lead elements of the first frame member to the corresponding bonding pads of a circuit die.

FIG. 3 illustrates the bonding of contact pads 12 with the tips of lead members 25. One lead frame section, for example, 22, is positioned on base 31 in such a manner that the ends of leads 25 are symmetrically located with respect to the center of post or pedestal 32. Circuit chip 11 is then inverted, as shown, and aligned with the ends of leads 25 such that each bonding pad 12 is placed in contact with a lead 25. A bonding needle 33 is then pressed against chip 11 and a sufficient pressure is applied, in combination with high frequency (preferably 5 to 100 kilocycles per sec.) vibratory energy to complete the formation of a suitable bond securing each pad 12 to a corresponding lead 25.

During the bonding operation, all sides of the lead frame section in 22 are laterally confined such that a slight buckling action is introduced in leads 25 due to the deformation of the ends of the leads at the bonding sites. The degree of such deformation is preferably between 25 and 50%. The resulting bond 34 in each of leads 25 is sufficient to avoid the danger of shorting which would result if the edges of the circuit chip came in contact with the bonded leads. An annular recess 35 is provided surrounding post 32 in order to accommodate the buckling action.

Figure 3A:
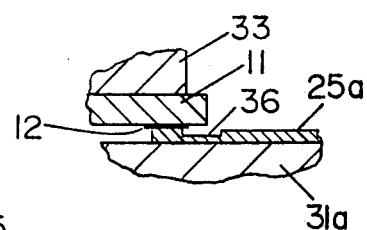
FIG. 3a is a fragmentary elevational view in cross section, showing an alternate embodiment for attaching the lead elements of the first frame member to the circuit die.

In the embodiment of FIG. 3a, leads 25a are provided with channels 36 located at the edge of die 11, as an alternate means of avoiding electrical shorts. Using this technique a modified base 31a can be employed, since annular recess 35 is not needed.

Figure 4:
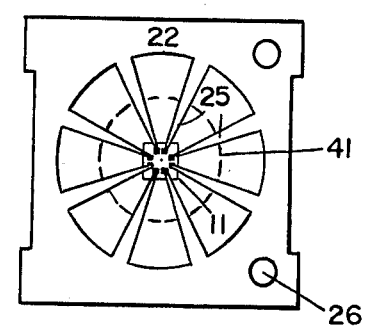
FIG. 4 is an enlarged plan view of the first frame member including the bonded circuit die of FIG. 1.

In FIG. 4 lead frame section 22, including the bonded die 11, is shown after separation from strip 21. In accordance with an optional feature of the invention, a rigid support 41 spanning the circuit die 11 is attached to leads 25 in order to relieve the bonding sites of excessive stress. For example, support means 41 may consist of a ceramic disc attached to the leads and to the die itself by means of a polymeric adhesive substance.

Figure 5:
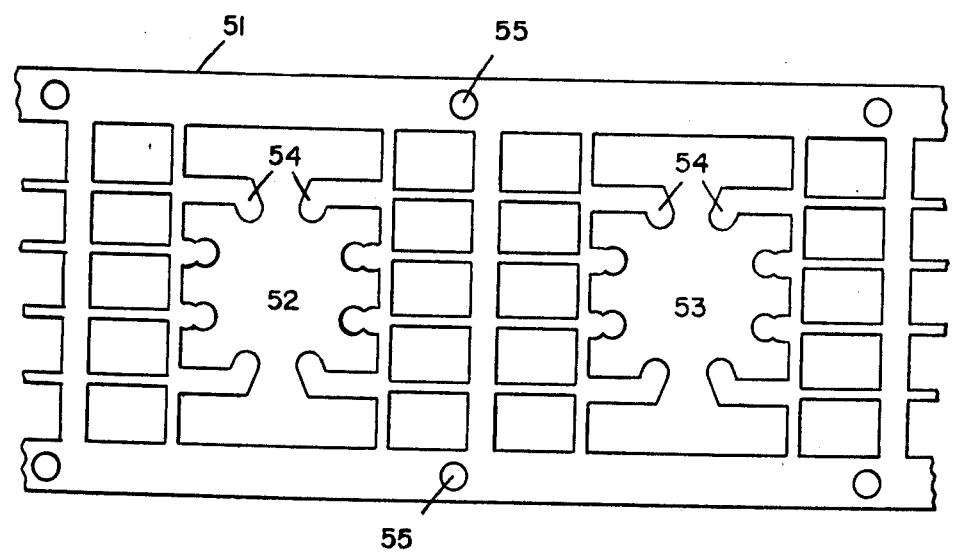
FIG. 5 is an enlarged plan view of the second lead frame member.

In FIG. 5 a second lead frame member is shown in the form of an elongated rectangular strip 51 composed of identical lead frame sections 52 and 53 comprising inwardly extending leads 54. Indexing holes 55 are provided for positioning the frame member, similarly as indexing holes 26 of the first lead frame member. Strip 51 is constructed of a heavier gage of sheet metal than strip 21 since the leads 54 must be adapted for external electrical connections extending from the completed unit.

In FIG. 6 the attachment of leads 25 to leads 54 is illustrated. This step is accomplished by placing strip 21 in contact with strip 51 whereby leads 25 are aligned with leads 54 in the manner shown. While the strips are so aligned, the lead members are welded or soldered to one another at points 61. The step of bonding the corresponding leads can be achieved in a single operation analogous to that illustrated in FIG. 3 for the attachment of leads 25 to bonding pads 12.

It will be apparent from the foregoing description that the combination of first and second lead frame members avoids the need for compromise which arises in any attempt to provide a single lead frame capable of serving both as connection means to external circuitry, and as internal connection means to the electrodes of an integrated circuit die.

Still further, a great reduction in tooling expense is provided since the exact configuration of the second lead frame member will not have to be changed in order to accommodate microcircuits having different sizes and shapes; or to accommodate microcircuits on which the bonding sites have different locations. Any such accommodations are readily made by providing the first lead frame with a different configuration, such that the leads thereof make the necessary connections between the die and the second lead frame. Thus any such tooling expense is limited to the first lead frame only, which, because of its smaller size and lighter weight involves much less expense.

In FIG. 7 the completed assembly is shown after the removal of the excess portions of strip 21 leaving only those segments of leads 25 which extend inwardly from welding sites 61. The completed assembly, as shown in FIG. 7, is then packaged, after which excess portions of strip 51 are removed to provide a completed unit as shown in FIG. 8. The final packaging operation is not unique to the present invention and may be carried out in accordance with any of various procedures well known in the art.

In accordance with an additional embodiment of the invention, the assembly shown in FIG. 4 may be further modified by cementing a second ceramic disc to the reverse side of the circuit die, thereby "sandwiching" the chip between two ceramic plates or discs. A preferred cement or adhesive to be used for this purpose is an epoxy resin. For some applications, the ceramic sandwich is sufficient as a complete external package. That is, the leads 25 may be severed from frame 22 to provide a finished, marketable unit consisting of die 11 and leads 25 sandwiched between two ceramic discs and sealed together by a synthetic resin adhesive.

In FIG. 9, a hermetically sealed ceramic package 91 is shown, comprising upper ceramic plate 92 in combination with a corresponding lower ceramic plate hermetically sealed together by means of glass layer 93. Leads 54 are sandwiched between the ceramic plates and embedded within glass seal 93. The remaining structure, including die 11 and leads 25, is bonded as shown in FIG. 7.

I claim:

1. An encapsulated semiconductor device having metal lead portions inside and outside the encapsulation extending from a semiconductor unit, said metal lead portions being originally a part of two substantially flat metal frame means each said means provided in a generally strip-like configuration and each said means comprising a plurality of identical frame members spaced apart on each said metal frame means and each frame member providing the metal lead portions for an ultimate semiconductor device, with the first of said metal frame means having lead portions each with an inner end portion and an outer end portion adapted to have semi-conductor means bonded to the lead portions thereof and being characterized by a flexibility which permits it to be wound on a spool for storage after semiconductor means are bonded thereto, and with the second of said metal frame means having frame members each of which is larger in area than a frame member of the first metal frame means and being stiffer and less flexible than said first metal frame means and not capable of being wound on a spool, said metal lead portions of said semiconductor device comprising the lead portions in a frame member from said first metal frame means extending outwardly from a central area at the inner end portions of the lead portions thereof, semiconductor means bonded to said first frame means lead portions at said inner end portions and said central area, said metal lead portions in said semiconductor device also having said second metal frame means bonded respectively to the outer end portions of said first frame means lead portions, said semiconductor unit and said first metal frame means lead portions and at least the bonded portion with said second metal frame means lead portions being in said encapsulation, and a portion of each of the latter lead portions extending out of said encapsulation for said device for connection with apparatus with which said semiconductor device is to be operated.

2. In a semiconductor device as defined in claim 1 wherein said first metal frame means is less than 4.0 mils thick, said semiconductor means is initially bonded to the inner end portions of the lead portions of said first frame means as an assembly and said second metal frame means is mechanically and electrically connected to said assembly wholly by the lead portions of said second metal frame means at the outer end portions of said first frame means.

* * * * *